United States Patent [19]
Ohta

[11] Patent Number: 5,751,607
[45] Date of Patent: May 12, 1998

[54] METHOD OF SPUTTER DEPOSITION SIMULATION BY INVERSE TRAJECTORY CALCULATION

[75] Inventor: Toshiyuki Ohta, Tokyo, Japan

[73] Assignee: NEC Corporation, Japan

[21] Appl. No.: 621,507

[22] Filed: Mar. 25, 1996

[30] Foreign Application Priority Data

Mar. 30, 1995 [JP] Japan ..................................... 7-072814

[51] Int. Cl.$^6$ ........................... G06F 9/455; C23C 14/52; H01L 21/203
[52] U.S. Cl. ............... 364/578; 364/469.02; 204/192.13; 204/298.03; 427/96; 118/715
[58] Field of Search ................................. 29/572; 427/38, 427/96; 250/396 R; 505/1; 364/468, 474.24, 578, 469.02; 118/715; 216/59; 204/192.11, 192.12, 192.1, 192.13, 298.01, 298.03; 428/210

[56] References Cited

U.S. PATENT DOCUMENTS

| | | | |
|---|---|---|---|
| 4,554,727 | 11/1985 | Deckman et al. | 29/572 |
| 4,800,100 | 1/1989 | Herbots et al. | 427/38 |
| 5,196,706 | 3/1993 | Keller et al. | 250/396 R |
| 5,227,364 | 7/1993 | Fujiwara et al. | 505/1 |
| 5,282,140 | 1/1994 | Tazawa et al. | 364/468 |
| 5,290,358 | 3/1994 | Rubloff et al. | 118/715 |
| 5,377,118 | 12/1994 | Leon et al. | 364/474.24 |
| 5,379,225 | 1/1995 | Tazawa et al. | 364/468 |
| 5,416,729 | 5/1995 | Leon et al. | 364/578 |
| 5,421,934 | 6/1995 | Misaka et al. | 216/59 |
| 5,482,602 | 1/1996 | Cooper et al. | 204/192.11 |
| 5,505,833 | 4/1996 | Werner et al. | 204/192.12 |
| 5,556,525 | 9/1996 | Krivokapic et al. | 204/192.12 |
| 5,580,428 | 12/1996 | Krivokapic et al. | 204/192.12 |
| 5,593,761 | 1/1997 | Itoh et al. | 428/210 |

OTHER PUBLICATIONS

H. Yamada, et al., "Sputter Equipmental Simulation With Monte Carlo Method", Technical Report of IEICE, (1994–09), pp. 51–58.

H. Yamada, et al., "Practical Monte Carlo Sputter Deposition Simulation With Quasi–Axis–Symmetrical (QAS) Approximation", International Electron Device Meeting of IEEE, San Francisco, 1994–12, pp. 553–556.

"Modeling of a Sputter Reactor Using the Direct Simulation Monte Carlo Method", by Kersch et al., IEEE, Electron Devices Meeting, Apr. 1992, pp. 7.6.1–7.6.4.

"Surface Charging Effects on Etching Profiles", by Murakawa et al., IEEE, Electron Devices Meeting, Apr. 1992, pp. 3.4.1–3.4.4.

"Flux Considerations in the Coupling of Monte Carlo Plasma Sheath Simulations with Feature Evolution Models", by Dalvie et al., IEEE Transactions on Electron Devices, vol. 39, No. 5, May 1992, pp. 1090–1099.

"3D Modeling of Contact Material Deposition and Its Impact on Equipment Design Parameters", by Baumann et al., IEEE, Electron Devices Meeting, 1993, pp. 35.3.1–35.3.4.

"Magnetron Sputtering Configuration for Coating 1.3 GHz Cavities with a Nb Film", by Minesrini et al., IEEE Particle Accelerator Conference, Jan. 1993, pp. 968–970.

"A Sputter Equipment Simulation System Including Molecular Dynamical Target Atom Scattering Model", by Yamada et al., IEEE Electron Devices Meeting, 1995 Technical Digest, pp. 4.5.1–4.5.4.

*Primary Examiner*—Kevin J. Teska
*Assistant Examiner*—Russell W. Frejd
*Attorney, Agent, or Firm*—Ostrolenk, Faber, Gerb & Soffen, LLP

[57] ABSTRACT

In a profile simulation of a thin film deposited on a substrate by sputtering, inverse trajectories from an area concerned of the substrate to a target are calculated by Monte Carlo method in order to reduce time required for the profile simulation. With trajectories arriving to the target and their generation probabilities, the profile simulation is performed applying a string model.

3 Claims, 4 Drawing Sheets

METHOD OF SPUTTER DEPOSITION SIMULATION BY INVERSE TRAJECTORY CALCULATION

BACKGROUND OF THE INVENTION

The present invention relates to a method of profile simulation of a thin film deposited by sputtering on a semiconductor substrate, and more particularly to an effective and precise method of profile simulation of sputter deposition for a small area, such as a contact hole. A sputter deposition profile depends not only on processing conditions but also on the configuration of the equipment used for sputtering. Since it takes too much time and cost by experimentation to determine the best combination of processing conditions and a equipment configuration, some simulation methods, have been proposed.

A simulation model for the purpose with Monte Carlo Method is desclosed on a paper "Sputter Equipment Simulation with Monte Carlo Method" by Yamada et al, pp 51–58, TECHNICAL REPORT OF IEICE, 1994-09, and a paper "Practical Monte Carlo Sputter Deposition Simulation with Quasi-Axis-Symmetrical (QAS) Approximation" by the same authors, pp 553–556, International Electron Device Meeting of IEEE, San Francisco, December 1994.

The prior art by the simulation model of these papers is described in the following paragraphs.

The simulation model consists of a model for calculating trajectories and their probabilities of particles sputtering from a target by Monte Carlo method, and a model for calculating profile of a thin film deposited on a substrate with QAS approximation.

FIG. 4 is a flowchart for calculating trajectories of particles sputtering from a target, considering their probabilities.

In step 41, the total number of particles to be generated from a grid point of a target, that is, a source of the scattering particles, is set proportional to the experimental erosion distribution of the target.

Then, until the number of generated particles reaches to the total number set in step 42, a particle is generated in step 43 with an ejection angle $\theta$ having distribution;

$$f(\theta) = 2\pi \cos\theta \sin\theta \quad (1)$$

and with releasing energy E of distribution $\psi(E)$ determined as follows applying the Thompson's distribution;

$$\Psi(E) = \frac{P\sqrt{1 - \frac{E_b + E}{\Lambda E_i}}}{E^2\left(1 + \frac{E_b}{E}\right)^3}$$

$$\Lambda = \frac{4M_1 M_2}{(M_1 + M_2)^2}$$

where, P denoting an atomosphere (of Ar gas, for example), $M_1$ and $M_2$ masses of an injecting (Ar) ion and a sputtering particle (Ti) thrust by the ion respectively, $E_b$ bond energy of the target, and $E_i$ energy of the ion.

By Monte Carlo method, the ejection angle $\theta$ and the directional angle $\phi$ on a plane parallel to the surface of the target are obtained as follows using uniform randam variables $e_1$ and $e_2$;

$$\theta = \cos^{-1}\sqrt{e_1} \quad (2)$$

$$\phi = 2\pi e_2 \quad (3)$$

and verosity $V_i$ of the particle is calculated from the releasing energy E which is obtained from the distribution $\psi(E)$ by Neumann's rejection method using three uniform randam variables as follows;

$$V_i = \sqrt{\frac{2E}{eM_2}},$$

e being charge of an electron.

In step 43, end position of a free path of the particle is calculated as follows, $e_3$ being a uniform randam variable, asuming that collision probability obeys Poisson distribution;

$$dL = \lambda(V_i)|\ln e_3|$$

where dL is length of a free path and $\lambda(V_i)$ is the mean free path of the particle with initial velocity $V_i$.

When the end position is found in step 45 out of bounds determined by geometrical configration of equipment, the simulation returns to the step 42 for generating a new particle.

If the particle is found entered into the substrate through its surface in step 46, the trajectory of the particle is filed in a trajectory file 10 in step 47 and the simulation returns to step 42, too.

Otherwise, a collision calculation is performed in step 48, using the classical dynamic formula under the 6–12 Lennard-Jones potential $U(r)$.

Here, using uniform randam variables $e_4$ and $e_5$, two values of velocity compornents in a direction $V_{g1}$ and $V_{g2}$ are calculated as follows by Box-Muller method asuming ion velocity follows Maxwell-Boltzmann's distribution.

$$V_{g1} = \sqrt{-2\left(\frac{kT}{M_1}\right)\ln e_4}\,\cos(2\pi e_5)$$

$$V_{g2} = \sqrt{-2\left(\frac{kT}{M_1}\right)\ln e_4}\,\sin(2\pi e_5)$$

k denoting Boltzmann constant. In this way, velocity components of an ion in X, Y and Z directions, in a coordinate space having its origin at gravity center of the particle and the ion, are calculated for obtaining relative velocity, relative collision energy in consequence, between the particle and the ion.

Then, the related data between the scattering angle • and the collision parameter b are calculated with Gausian integral;

$$\chi = \pi - 2\int_{r_{min}}^{\infty} \frac{b}{r^2\sqrt{1 + \left(\frac{b}{r}\right)^2 + \frac{U(r)}{E}}}\,dr$$

where $r_{min}$ is the minimum atomic distance between the particle and the ion and $E_r$ is the relative collision energy.

On the basis of the calculated data, the relation of the scattering angle • to the collision parameter is simplified into a linear approximation;

$$\chi = \pi\left(1 - \frac{b}{b_{max}}\right)$$

where $b_{max}$ is the collision radius.

Then, collision cross section $p=\pi b^2_{max}$ is calculated.

With the collision radius $b_{max}$, collision parameter $b^{calc}$ and scattering angle $*_{calc}$ of the particle concerned is calculated as follows using a uniform randam variable $e_6$;

$$b_{calc} = b_{max} \sqrt{e_6}$$

$$\chi_{calc} = \pi \left(1 - \frac{b_{calc}}{b_{max}}\right).$$

Then, scattering angle $\theta_1$ of the particl, in a coordinate space having its origin at the coordinates of the ion before collision, and relative energy ratio k of the relative energy after collision to that before collision are calculated as follows;

$$\theta_L = \tan^{-1} \frac{M_2 \sin \chi_{calc}}{M_1 + M_2 \cos \chi_{calc}}$$

$$k = 1 - \frac{4M_1 M_2 \sin^2\left(\frac{\chi_{calc}}{2}\right)}{(M_1 + M_2)^2}.$$

Using the relative energy ratio k, relative speed after collision is obtained from that before collision by multiplying with $\sqrt{k}$.

As for rotating angle $\phi_1$ of the particle, it is calculated with a uniform randam value $e_7$ as $\phi_1 = 2\pi e_7$.

Thus, initial condition of a new free path of the particle is obtained by converting these values with coordinates of the original coordinate space, and the calculation returens to the step 44 for calculating the end of the new free path.

Steps 44 to 48 are repeated until the particle attains to the substrate, or goes out of bounds. And steps 42 to 49 are repeated until the number of generated particle attains the total number set at the step 41 and these steps 41 to 49 are performed for every grid point of the target.

Thus, the number of trajectories from the target to the substrate stored in the trajectory file 10, with density proportional to their probability.

Now, string model is described in connection with an example for calculating thin film profile deposited on a contact hole provided on a surface of a substrate.

FIG. 3 is a schematic diagram of a string model for a contact hole.

Profile calculation is performed according to following procedures.

1. Trajectories entering through a small area of the surface 31 specified near the contact hole are extracted from the trajectory file 10.

2. Each of the extracted trajectories entering through the small surface 31 with various angles is considered to enter uniformly to every point on the small area 31.

3. A string point 32 is initialized on a differential section of a cross line 33 of the contact hole.

4. A number of extracted trajectories arriving at the string point through the substrate surface out of opening 34 of the contact hole is reduced from total number of the extracted trajectories. (This procedure is called "shadowing" hereafter.)

5. The string point is shifted inward perpendicularly to the cross line 33 on a cross section 35 according to the rest number of the extracted trajectories, namely according to number of particles deposited on the current string point.

6. These procedures described in above item 3 to 5 are performed for every differential section of the cross section 33.

7. The procedures above described are repeated a necessary number of times for every shifted string point.

Thus, a profile of the thin film deposited by sputtering on a contact hole is simulated with a sufficient precision.

However, on general, all areas of the substrate need not be simulated. There are many cases where it is sufficient to simulate deposition profiles near the center and certain edges, for example.

In the prior art, an enormous number of trajectories terminating at non-relevant area of the substrate surface are calculated in vain. This is a waste of calculation.

SUMMARY OF THE INVENTION

Therefore, a primary object of the present invention is to provide a practical profile simulation method for a thin film deposited by sputtering on a substrate, with a high calculation efficiency and sufficient preciseness.

In order to achieve the object, in a method of the present invention for a profile simulation of a thin film deposited by sputtering, comprising a step for calculating trajectories of sputtering particles generated according to a generation probability of each of the sputtering particles from a target by Monte Carlo method taking account of equipmental geometry wherein the trajectories are traced and collisions of the sputtering particles with background gas, and a step for calculating growth of the thin film at a point according to proportional number of the trajectories arriving to the point;

the trajectories arriving to the point are calculated inversely considering that each of the trajectories arriving at the point follows one of trajectories of particles starting from the point and arriving in the target on a same behaviour with the sputtering particles.

Therefore, the number of trajectories to be calculated can be limited to the number of trajectories arriving at a relevant small area of the substrate surface, instead of the trajectories arriving at the entire substrate surface as calculated in the prior art; resulting in a remarkable reduction in the time required for the profile simulation.

BRIEF DESCRIPTION OF THE DRAWINGS

The foregoing, further objects, features, and advantages of this invention will become apparent from consideration of the following description, the appended claims, and the accompanying drawings in which the same numerals indicate the same or the corresponding parts.

DETAILED DESCRIPTION OF THE PREFERRED EMBODIMENTS

Now, embodiments of the present invention will be described in connection with the accompanying drawings.

Figure 1:
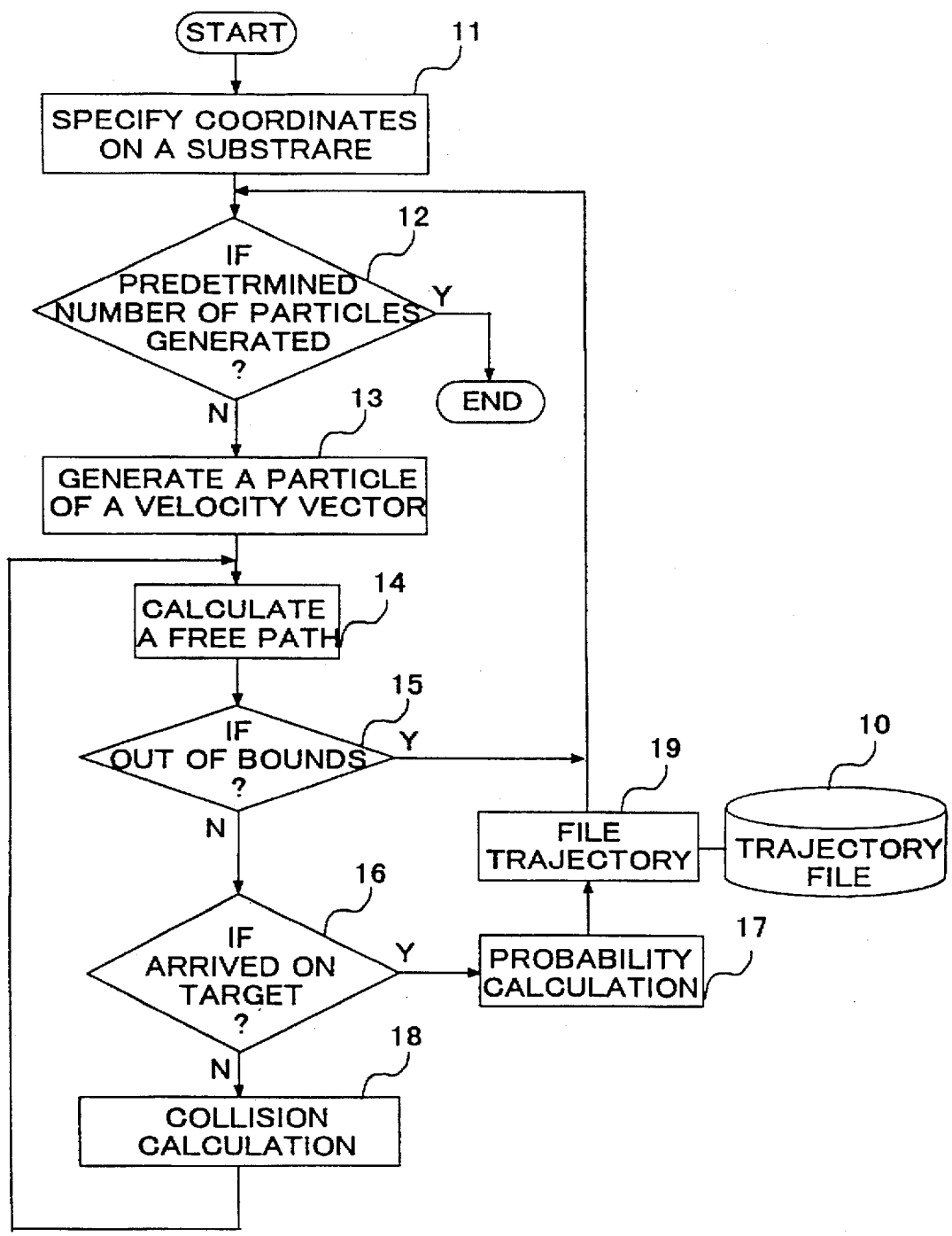
FIG. 1 shows a flow of processing steps for filing probable trajectories in an embodiment of the present invention for profile calculation of a thin film deposited by sputtering from a target on a substrate.

FIG. 1 shows a flow of processing steps for filing probable trajectories in an embodiment of the invention for profile simulation of a thin film deposited by sputtering from a target on a substrate.

In the embodiment, trajectories of sputtering particles are calculated inversely as if they are ejected from a substrate and arrive to a target.

In step 11, coordinates of a small area concerned on the substrate is selected. Particles ejecting from, that is, entering to virtually, the selected coordinates are generated one by one in step 13 until a determined number checked in step 12, using a uniform random valiable.

Here, although any distribution can be used for the ejecting angle or the velocity of the particle, appropriate distributions should be applied in order to collect probable trajectories for an effective simulation. In the embodiment, initial verocity components are calculated by Box-Muller method asuming each of the velocity components of the particle follows Maxwell-Boltzmann's distribution, in a similar way as described in connection with the step 48 of FIG. 4.

Figure 4:
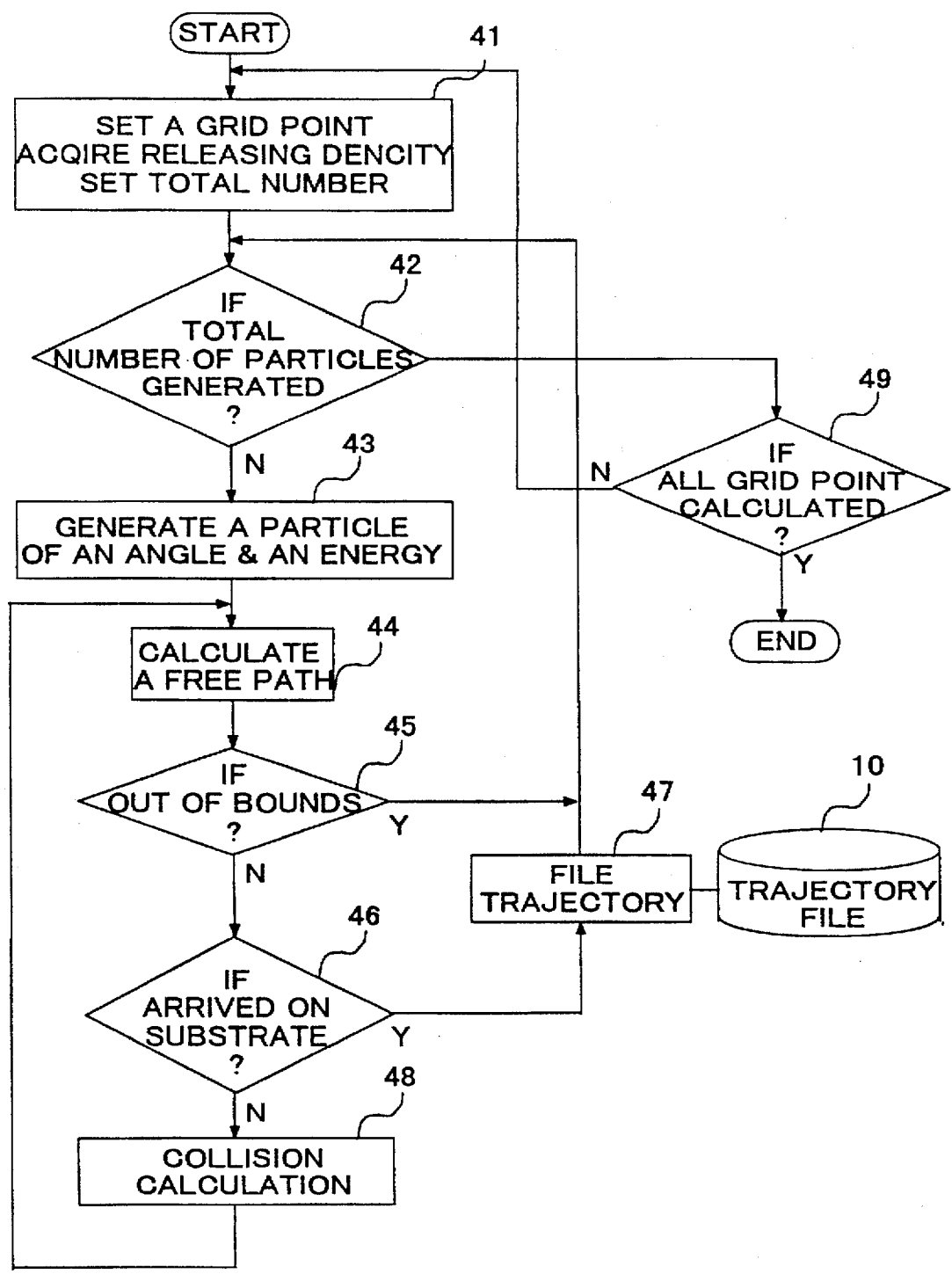
FIG. 4 is a flowchart of the prior method for calculating trajectories of particles sputtering from a target.

Then, in step 14, end point of a first free path of the particle is calculated in a same way as in the step 44 of FIG. 4, considering that the first collision point of the inverse trajectory be at the end of the free path. When the first collision point, namely the end point of the first free path, is found out of bounds of the equipment in step 15, the processing step is returned to the step 12, and another particle is generated for calculating another trajectory.

When the first collision point is inside the bounds, the step goes to a step 16, where the trajectory is examined whether it reaches to a point on a surface of the target. When the trajectory does not reach to the target, a collision calculation is performed in step 18 in the same way as in the step 48 of FIG. 4 for obtainnig initial verocity and direction of a next free path and the process returns to the step 14 for calculating end point of the next free path.

When the trajectory reaches to a point of the surface of the target, the trajectory is filed in a trajectory file 10 in step 19 as in the step 47 of FIG. 4. However, here in the embodiment, a generation probability $P_g$ of the trajectory is calculated for enhancing preciseness of the simulation in step 17 before filing the trajectory in step 19.

In the embodiment, the experimental erosion distribution $\epsilon(x,y)$ of the target, the ejecting angle distribution $f(\theta)$ expressed by the equation (1) and the length distribution, expornential distribution, of the first free path dL of the trajectories, that is the last free path of inverse trajectories, are considered as followings.

$$P_g = \epsilon(x,y) \cdot 2\pi \cos\theta \sin\theta \cdot \frac{1}{\lambda(V_i)} e^{-\frac{dL}{\lambda(V_i)}}$$

where, (x,y) are coordinates of the target surface where an inverse trajectory enters, $\theta$ is entrance angle of the trajectory to the target surface, dL is length of the last free path of the trajectory and $\lambda(V_i)$ is length of the mean free path of the particle entering to the subatrate with velocity $V_i$.

In the embodiment, each of inverse trajectories thus calculated is filed in the trajectory file 10 with its generation probability $P_g$ in step 19, regarded as a trajectory ejected from the target and arriving to the small area concerned on the substrate specified by the coordinates.

Figure 2:
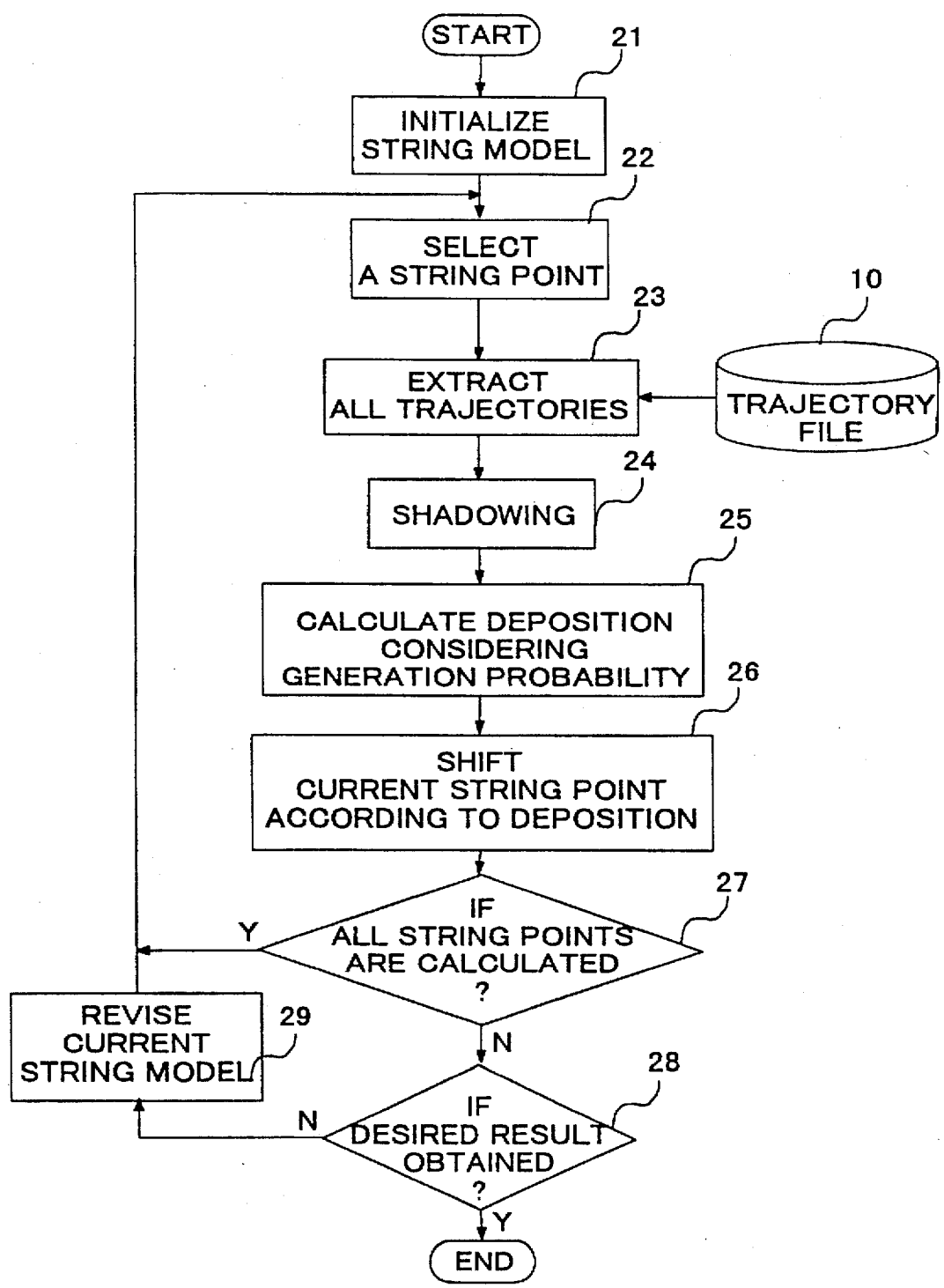
FIG. 2 is a flowchart of profile calculation procedures applying a string model.
Figure 3:
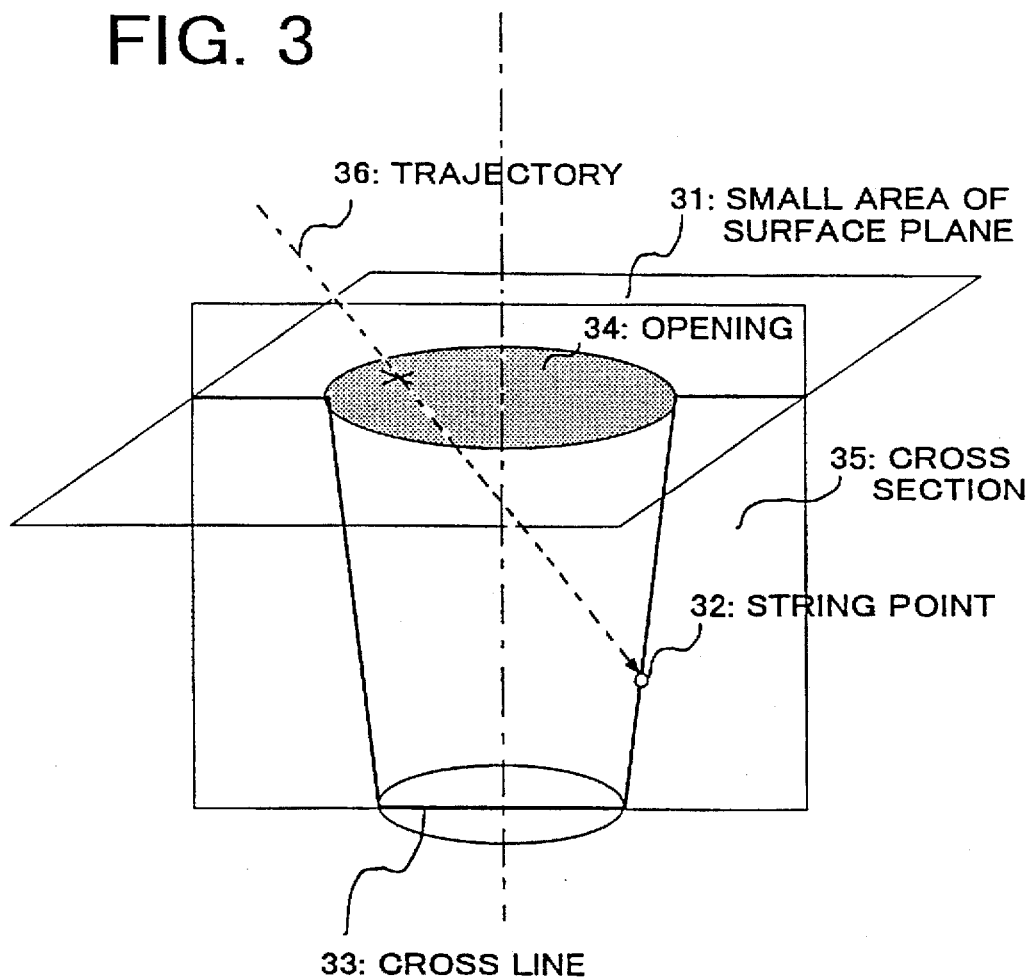
FIG. 3 is a schematic diagram illustrating string model for a contact hole.

Using trajectory thus collected, a profile simulation is performed as illustrated in FIG. 2, in the same way with the prior art beforehand described.

In step 21, a string model is initialized according to a profile, of a contact point for example, to be simulated. Then, deposition of particles on a string point selected in step 22 is calculated in step 25 from trajectories acquired in step 23 from the trajectory file 10 and filtered by shadowing in step 24, and the string point is shifted according to the deposition calculated, asuming that each of all trajectories in the trajectory file 10 enters uniformly trough every point of the specified small area.

Here, in the embodiment, deposition, namely shifting displacement of the string point is considered in proportional to the sum total of the generation probabilitie $P_g$. calculated in the step 17 of FIG. 1 of each of the trajectories after the shadowing.

Steps 22 to 26 are performed for all string points checked in step 27, and repeated several times, eight times for example, for obtaining a desired result revising the string model in step 29 according to the shifted string points.

Thus, a profile simulation of a thin film deposited by sputtering on a substrate is performed in the embodiment.

Now, number of transactions, or particles, to be generated for the Monte Carlo simulation will be considered.

Suppose that 10,000 particles are to be sputtered on an area concerned of 0.2 $mm^2$ of a substrate surface of 10×10 $cm^2$ for obtaining a sufficient convergence of the simulation.

In the prior art, the number Np of transactions to be generated attains;

$$Np = 2 \times 10,000 \times 10 \times 10 \ cm^2/0.2 \ mm^2$$

when a half of particles go out of bounds.

In the embodiment of the inverse trajectory calculation, although the generation probability $P_g$. about 0.2 in an example for a contact hole, should be considered in addition to the rate of particles going out of bounds, it is sufficient with the corresponding number $N_i$;

$$Ni = 2 \times 10,000/0.2 = Np/10,000$$

So, a simulation can be performed with 1/10,000 of calculation time needed for the prior art.

In the embodiment heretofore described, initial velocity of a particle is calculated on the assumption that it follows Maxwell-Boltzmann's distribution, but any other appropriate distribution can be applied as described considering equipmental configulation, existance of a collimeter, for example.

Further, in the embodiment, the experimental erosion distribution of the target, the ejecting angle distribution and the length distribution of the first free path are considered for the genetation probability $P_g$, but any other appropriate distributions, Thompson's distribution of releasing energy for example, can be considered according to object of the simulation in the scope of the invention.

Further more, in another embodiment of the invention, when a particle results an inverse trajectory entering to the target with an ejection angle of low probabilities, the last free path of the inverse trajectry is replaced with a path entering with an ejecting angle generated according to the equation (2) using another uniform randam valiable, for enhancing simulation efficiency with trajectories more probable. In the case, the last free path is recalculated also in the step 17, on the asumption that it starts from the same collision point with the same velocity and a newly calculated ejecting angle and the same directional angle on a plane parallel to the target surface, for recalculating coordinates for the experimental erosion distribution of the target $\epsilon(x,y)$ and the length distribution of the last free path. The directional angle may be recalculated according to the equation (3) using another uniform randam variable, of course.

Still further, although inverse trajectories starting a specified area are described, in the embodiments, to be collected in the trajectory file for being applied uniformly in the profile calculation performed according to a string model, they can be collected separately for each area corresponding to each string point or to each segment into which the string points are grouped, in case a profile of a sputter deposition in a trench traversing a substrate is simulated, for example.

What is claimed is:

1. A method of profile simulation of a thin film deposited by sputtering, comprising the steps of:

determining trajectories of sputtered particles generated according to a generation probability of each of said sputtered particles from a target by a Monte Carlo method which considers equipmental geometry where said trajectories are traced and sputtered particle collisions with background gas, and determining growth of the thin film at a location according to a proportional number of said trajectories of sputtered particles arriving at said location; and determining said trajectories arriving at said location by an inverse calculation which considers that each of said trajectories arriving at said location follows one of said trajectories of virtual particles starting from said location and extending to said target assuming said virtual particles travel in the same manner as said sputtered particles.

2. The method of profile simulation according to claim 1; wherein said generation probability is calculated from an experimental erosion distribution of said target, a distribution of length of a path ejected from said target by inverse calculation of each of said trajectories arriving at said location, and a distribution of ejecting angle from said target of each of said trajectories arriving at said location.

3. The method of profile simulation according to claim 1; wherein said generation probability is calculated from an experimental erosion distribution of said target, a distribution of length of a path ejected from said target with an ejecting angle generated according to an ejecting angle distribution for replacing a path ejected from said target by inverse calculation of each of said trajectories arriving at said location, and said ejecting angle distribution.

* * * * *